United States Patent [19]
Fujimoto et al.

[11] Patent Number: 5,227,324
[45] Date of Patent: Jul. 13, 1993

[54] GATE ARRAY AND MANUFACTURING METHOD OF SEMICONDUCTOR MEMORY DEVICE USING THE SAME

[75] Inventors: Kazuya Fujimoto, Tenri; Yuichi Satoh, Mie; Setsufumi Kamuro, Matsudo, all of Japan

[73] Assignee: Sharp Kabushiki Kaisha, Osaka, Japan

[21] Appl. No.: 849,348

[22] Filed: Mar. 11, 1992

[30] Foreign Application Priority Data

Mar. 15, 1991 [JP] Japan .................................. 3-76851

[51] Int. Cl.$^5$ .............................................. H01L 21/70
[52] U.S. Cl. .................................... 437/51; 437/173; 437/195
[58] Field of Search ............ 437/48, 51, 173, 195; 357/45, 71

[56] References Cited

U.S. PATENT DOCUMENTS

| | | | |
|---|---|---|---|
| 4,500,906 | 2/1985 | Ohno et al. | 357/45 |
| 4,716,452 | 12/1987 | Kondoh et al. | 357/45 |
| 4,745,084 | 5/1988 | Rowson et al. | 357/45 |
| 5,031,018 | 7/1991 | Shirato et al. | 357/45 |

Primary Examiner—Tom Thomas

[57] ABSTRACT

A gate array is provided which includes a semiconductor substrate having a main surface. The main surface includes a cell region and a channel region adjacent to the cell region. A cell column including a plurality of basic cells arranged regularly is provided in the cell region. A first interconnecting line is provided in the channel region for connecting the basic cells. In accordance with the gate array, as the first interconnecting line is formed in the channel region in advance for connecting the basic cells, it is not necessary to form a first interconnecting line when manufacturing a semiconductor integrated circuit device. Accordingly, the time period for development of a semiconductor integrated circuit device can be reduced as compared with a case where conventional basic cells are used.

4 Claims, 10 Drawing Sheets

Y DIRECTION

X DIRECTION

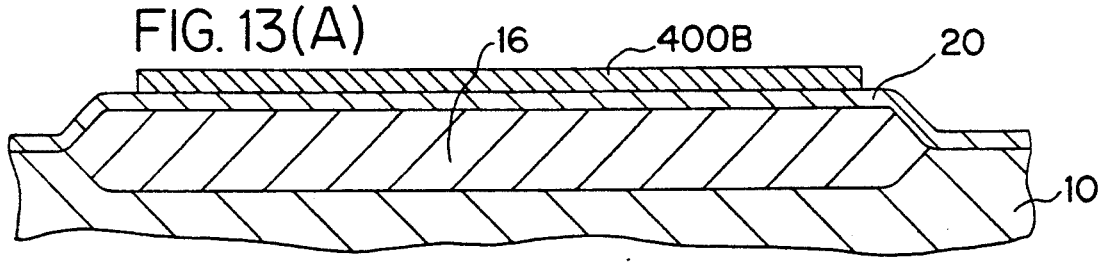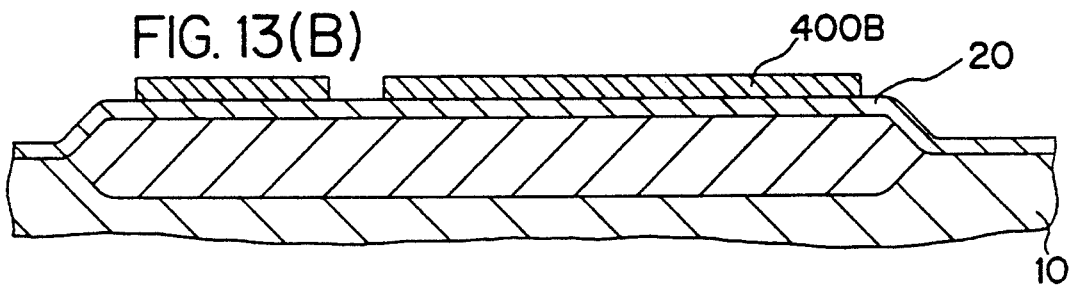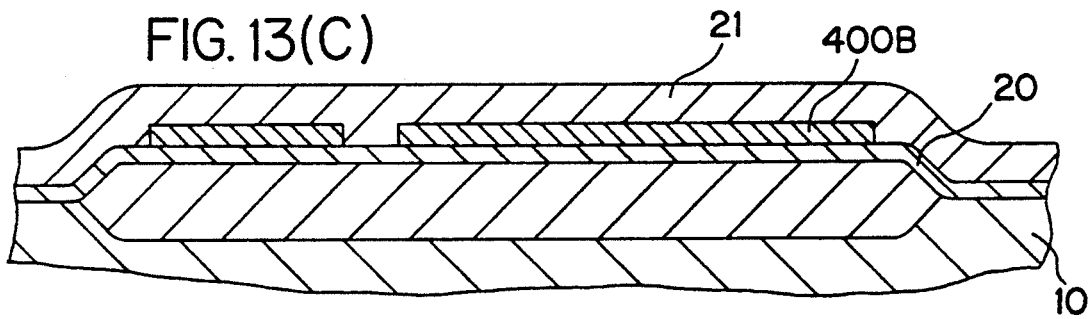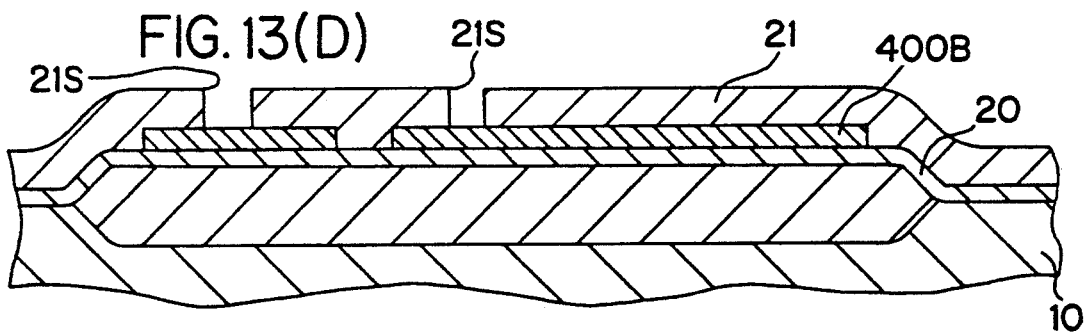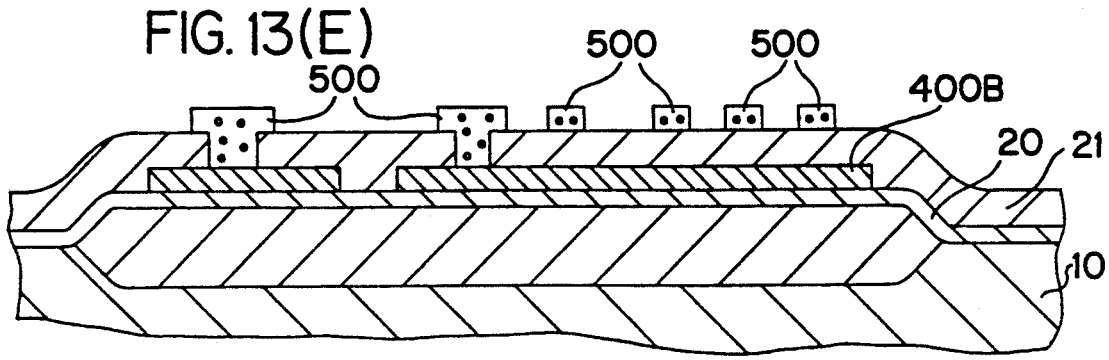

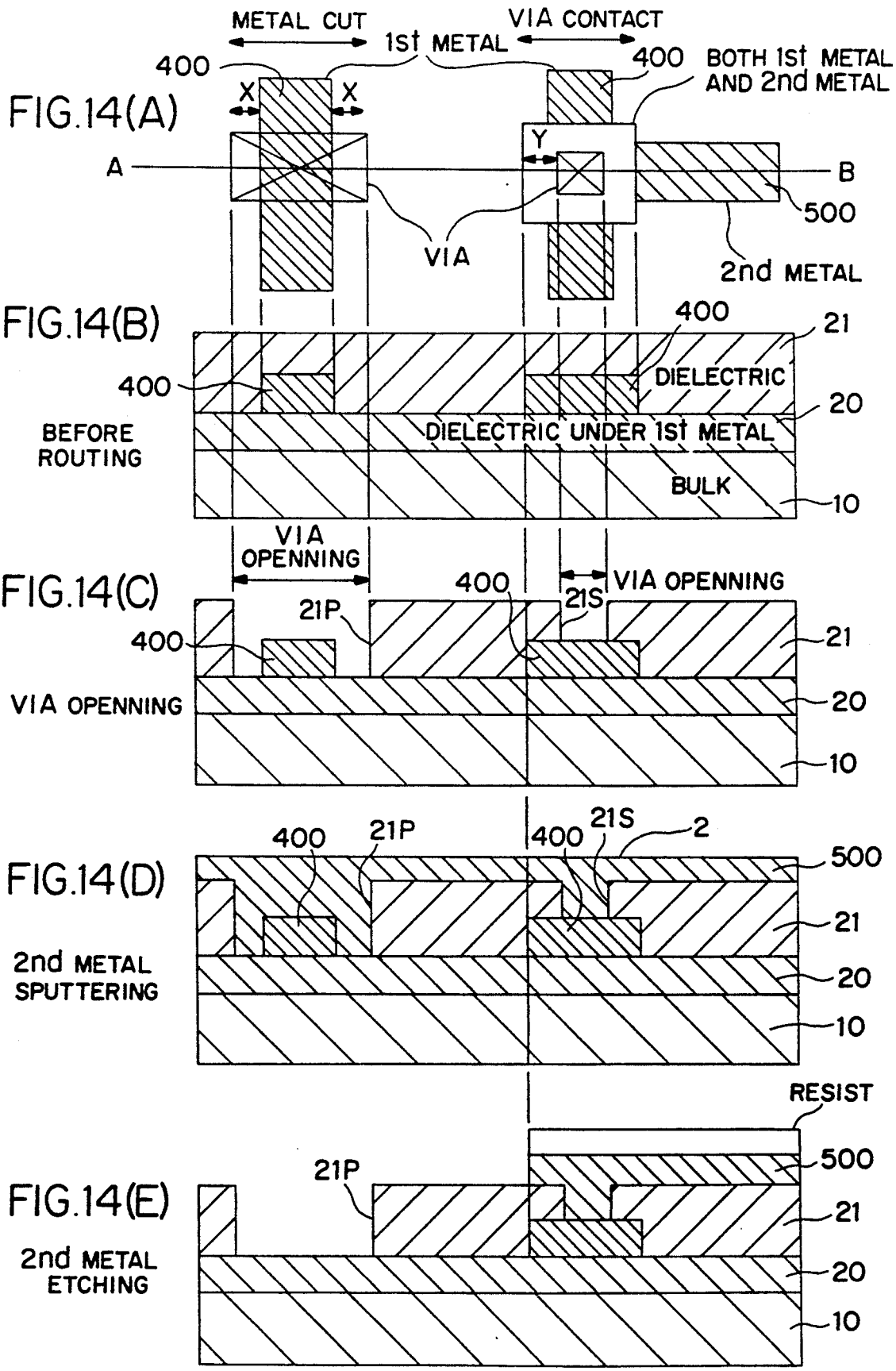

GATE ARRAY AND MANUFACTURING METHOD OF SEMICONDUCTOR MEMORY DEVICE USING THE SAME

BACKGROUND OF THE INVENTION

1. Field of the Invention

The present invention generally relates to gate arrays and, more particularly, the present invention relates to gate arrays which are improved so that a time period required for development of a semiconductor integrated circuit device can be shortened. The present invention further relates to a manufacturing method of a semiconductor integrated circuit device using such a gate array.

2. Description of the Background Art

A gate array is a chip on which circuit elements (basic cells) such as transistors for constituting a logic gate are regularly arranged. Gate arrays are manufactured and stocked in advance. A manufactured and stocked gate array is called a "master slice". A gate array is provided with an interconnection pattern designed for each customer's circuit to be finished as an LSI at the end. Designing of the interconnection pattern (a customized design) is usually carried out according to a procedure as shown in FIG. 1, using an automatic layout design. An interconnection pattern of a basic circuit such as each kind of logic gate, a flip-flop and so on is designed (referred to as a microcell) and registered in a library in advance and then automatically laid out and interconnected.

Examples of lay-out forms of a master slice of a gate array are shown in FIGS. 2 and 3. An island array shown in FIG. 2 is often found in a bipolar gate array. A continuous column array shown in FIG. 3 is often used for a CMOS gate array.

Referring to FIGS. 2 and 3, a plurality of basic cells 1 are arranged regularly in a chip T. Basic cells 1 are connected to each other by an interconnection process after a contacting process according to a circuit to be constructed, thereby forming a semiconductor integrated circuit device.

In these figures, a region where there is no basic cell 1 is called a "channel region" 2 where interconnecting lines are formed for connecting basic cells 1. Peripheral cells 3 are provided in the periphery of chip T.

The semiconductor integrated circuit device is formed by providing a first interconnecting line in the channel region 2, then forming an interlayer insulating film over the first interconnecting line, and further providing a second interconnecting line over the interlayer insulating film.

The use of a gate array in forming a semiconductor integrated circuit is intended for reducing the time period of its development. There has been an increasing need for a further reduction in this time period in recent years.

In order to meet such a need, an improved gate array has been developed for connecting basic cells by a single interconnection layer instead of two interconnection layers. A single interconnection layer reduces necessary masking processes, which makes it possible to shorten the period for the development.

However, such a gate array has a difficulty that a chip area is increased due to a decrease in the interconnecting efficiency, which results in an increased cost. Accordingly, although a gate array having a single interconnection layer can be used for testing the operation, it is not suitable for practical manufacture.

SUMMARY OF THE INVENTION

An object of the present invention is to provide a gate array which is improved so as to further reduce a time period required for development of a semiconductor integrated circuit device.

Another object of the present invention is to provide a gate array which is improved so as to further reduce the time period required for development of a semiconductor integrated circuit device without increasing the chip area.

A still other object of the present invention is to provide a CMOS gate array which is improved so as to further reduce the time period required for development of a semiconductor integrated circuit device.

Yet another object of the present invention is to provide a manufacturing method of a semiconductor integrated circuit device using a gate array having the characteristics as stated above.

In order to achieve the above-mentioned objects, a gate array according to the present invention includes a semiconductor substrate having a main surface. The main surface includes a cell region and a channel region adjacent to the cell region. Cell columns formed of a plurality of basic cells arranged regularly are provided in the cell region. A first interconnecting line is provided in the channel region for connecting the plurality of basic cells and the other basic cells.

In the gate array according to the present invention, it is not necessary to form a first interconnecting line when manufacturing a semiconductor integrated circuit device since the first interconnecting line is formed in advance in the channel region for connecting the basic cells.

In a method of manufacturing a semiconductor integrated circuit device according to another aspect of the present invention, firstly, a gate array is prepared, which includes a semiconductor substrate having a main surface, the main surface including a cell region and a channel region adjacent to the cell region, cell columns are provided in the cell region which have a plurality of basic cells arranged regularly, and a first interconnecting line is provided in the channel region for connecting the basic cells.

Then, the first interconnecting line is disconnected according to design data of the circuit to be constructed. An interlayer insulating film is formed over the semiconductor substrate, covering the first interconnecting line. A through-hole is formed in the interlayer insulating film for exposing part of the first interconnecting line or the basic cells. A second interconnecting line is formed on the interlayer insulating film, which is electrically connected to the first interconnecting line or the basic cells through the through-hole.

In accordance with the method of manufacturing the semiconductor integrated circuit device according to another aspect of the present invention, the chip area is not increased and a double layered interconnection structure including the first and second interconnecting lines can be obtained.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 13(A)-13(E) show cross-sectional views taken along the line Y—Y of a CMOS gate array as illustrated in FIG. 9.

FIGS. 14(A)-14(E) are plan views showing the structure for a CMOS gate array for an embodiment of the present invention.

DESCRIPTION OF THE PREFERRED EMBODIMENTS

An embodiment according to the present invention will now be described below.

Figure 1:
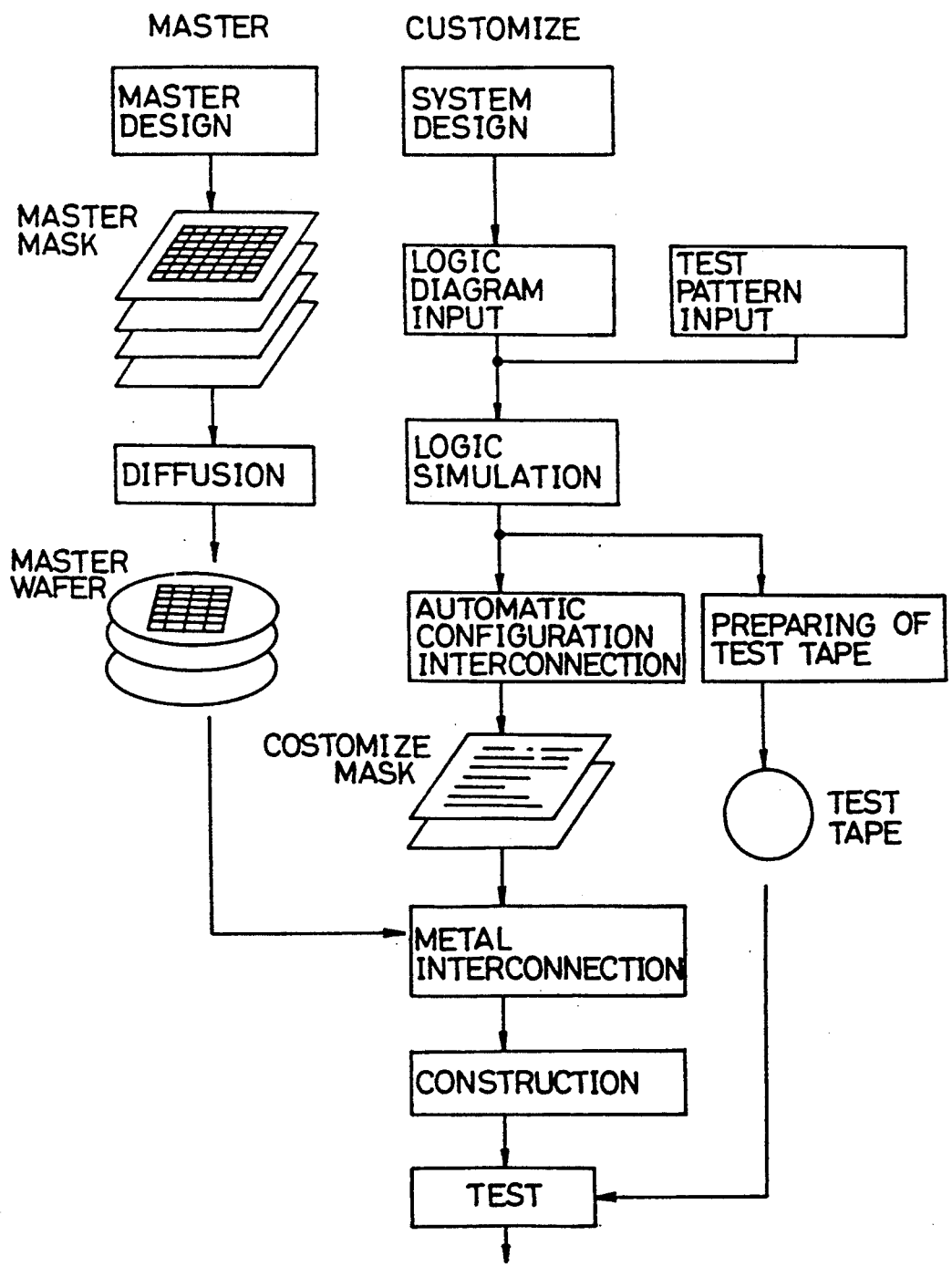
FIG. 1 is a diagram showing a procedure for developing a conventional semiconductor device.
Figure 2:
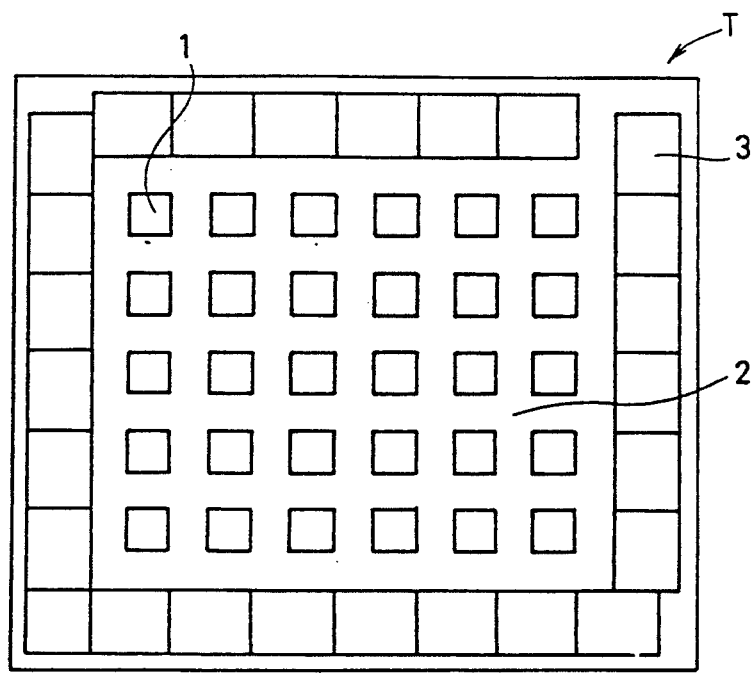
FIG. 2 is a plan view of a conventional bipolar gate array.
Figure 3:
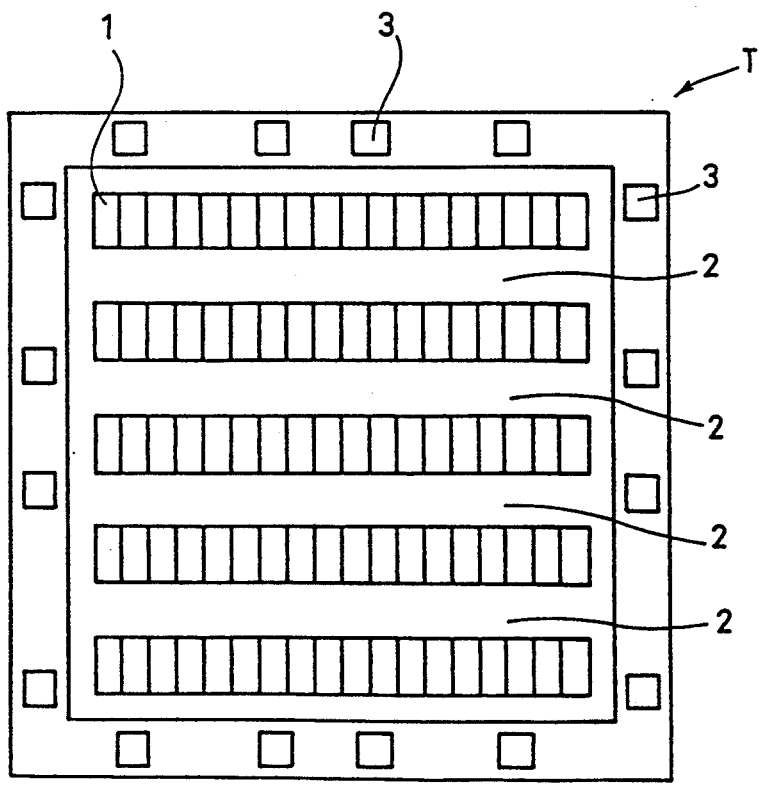
FIG. 3 is a plan view of a conventional CMOS gate array.
Figure 4:
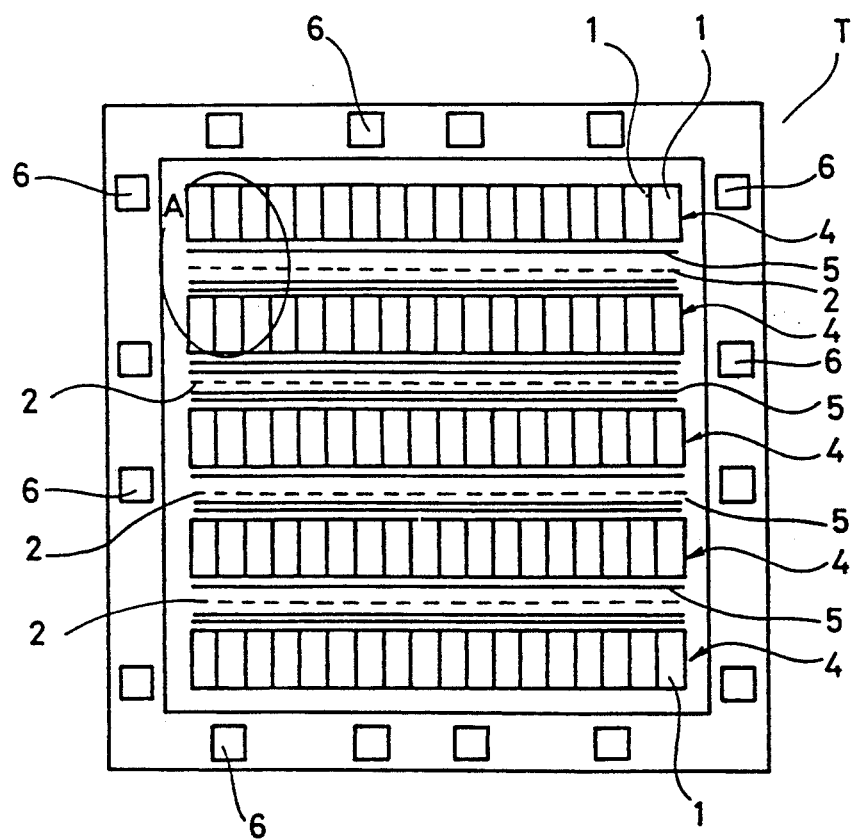
FIG. 4 is a plan view of a CMOS gate array according to one embodiment of the present invention.

FIG. 4 is a plan view of a chip of a gate array according to one embodiment of the present invention.

A plurality of chips T are arranged in a matrix on a wafer (not shown).

Referring to FIG. 4, cell columns 4 having basic cells 1 arranged adjacent to each other are formed on a chip T. Now, a direction in which basic cells 1 are arranged adjacent to each other to form a cell column 4 (the left to right direction in the figure) will be referred to as the "X direction" and a direction at right angles to the X direction will be called the "Y direction".

A region between cell columns 4 is called a channel region 2. This gate array is a channel fixed type gate array. Seven first interconnecting lines 5 independent of each other are provided in each channel region 2. First interconnecting lines 5 are used for connecting the basic cells 1. Each of the first interconnecting lines 5 extends parallel to cell columns 4, i.e., in the X direction. I/O pads 6 as peripheral cells are provided in the outer peripheral portions of chip T, which surrounds all of the cell columns 4.

The structure of the gate array according to an embodiment of the present invention will now be described in more detail.

Figure 5:
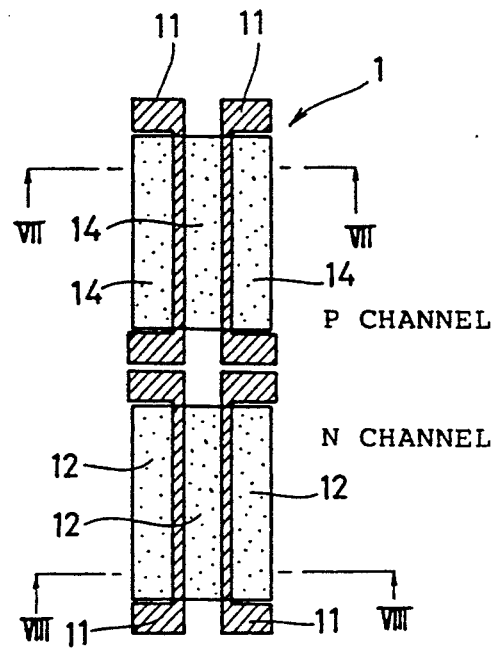
FIG. 5 is a layout diagram of a basic cell used in an embodiment of the present invention.
Figure 6:
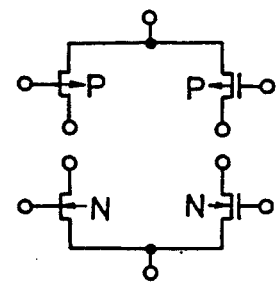
FIG. 6 is an equivalent circuit diagram of the basic cell used in an embodiment of the present invention.
Figure 7:
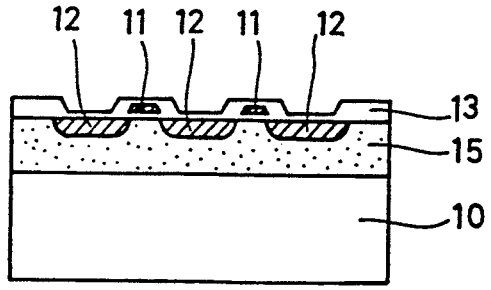
FIG. 7 is a cross-sectional view taken along the line VII—VII in FIG. 5.
Figure 8:
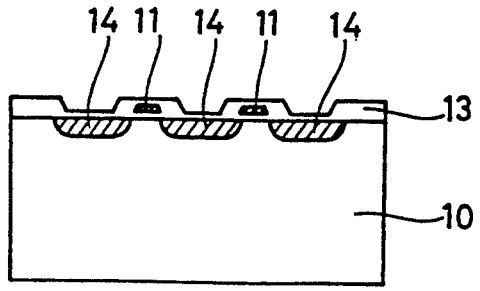
FIG. 8 is a cross-sectional view taken along the line VIII—VIII in FIG. 5.

FIG. 5 is a diagram showing a layout pattern of a basic cell 1. FIG. 6 is an equivalent circuit diagram of the basic cell. FIG. 7 is a cross-sectional view taken along the line VII—VII in FIG. 5. FIG. 8 is a cross-sectional view taken along the line VIII—VIII in FIG. 5.

Referring to FIG. 7, an n well 15 is formed on a main surface of a p-type semiconductor substrate 10. A polysilicon electrode 11 is provided over the p-type semiconductor substrate 10. p+ diffusion layers 12 are formed on the surface of the n well 15 and on both sides of the polysilicon electrode 11 An $SiO_2$ film 13 is formed over the p-type semiconductor substrate 10, and covers the polysilicon electrode 11.

Referring to FIG. 8, a polysilicon electrode 11 is provided over a p-type semiconductor substrate 10. n+ diffusion layers 14 are formed on the main surface of the p-type semiconductor substrate 10 and on both sides of the polysilicon electrode 11. An $SiO_2$ film 13 is formed on p-type semiconductor substrate 10 and covers the polysilicon electrode 11.

Figure 9:
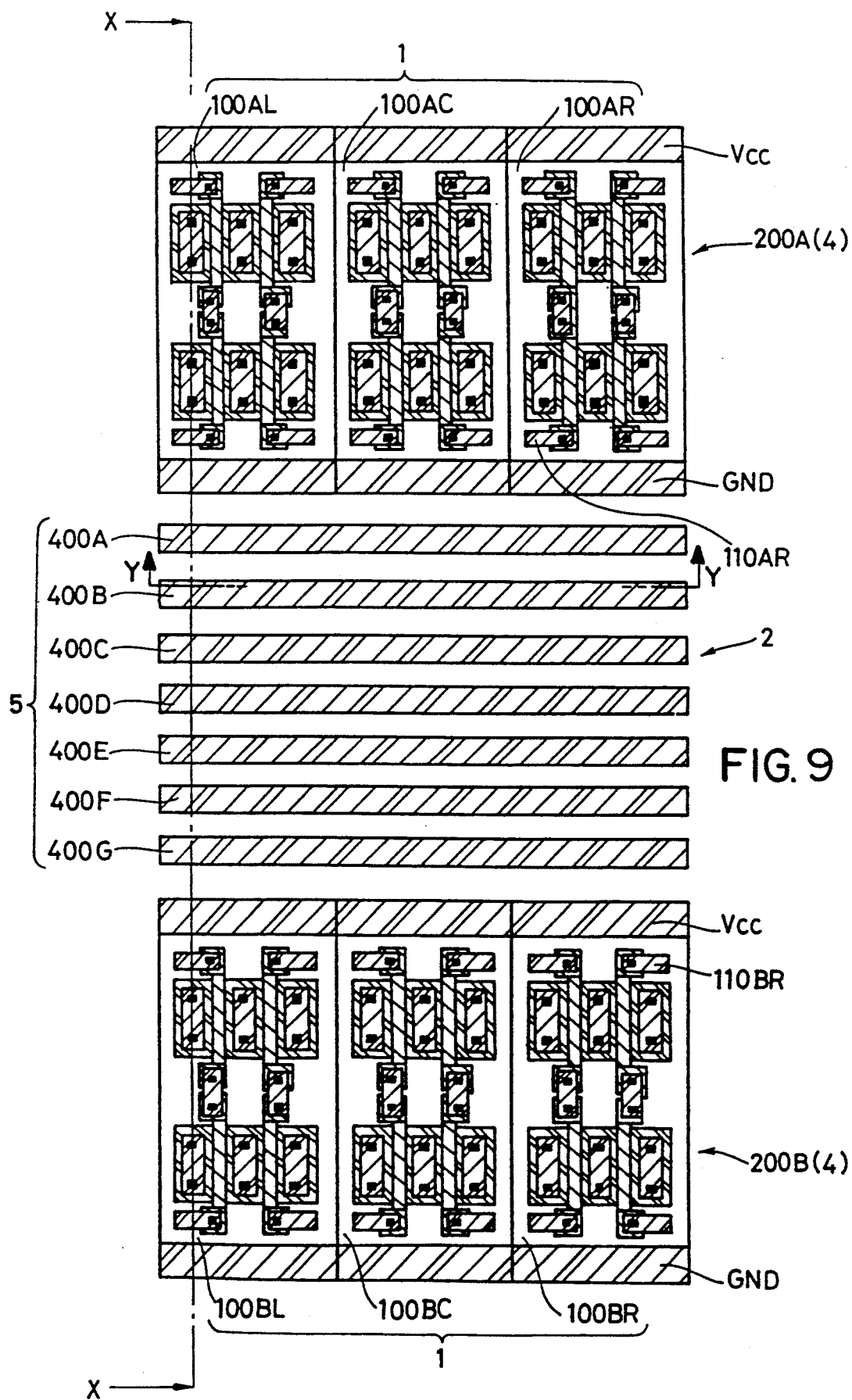
FIG. 9 is an enlarged view of the A part in FIG. 4.
Figure 10:
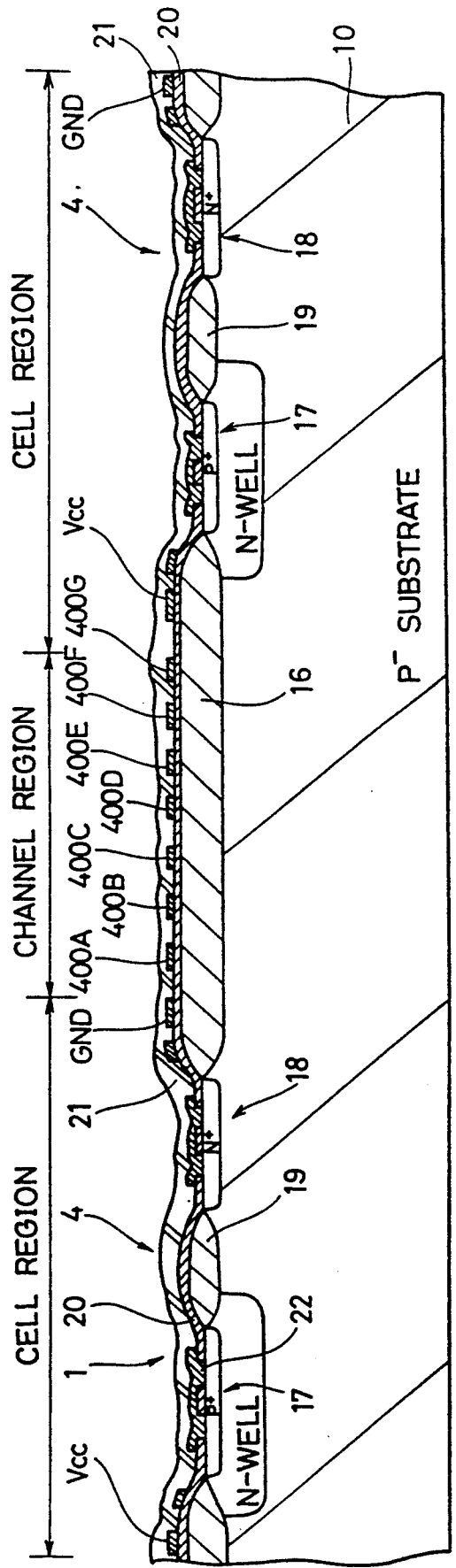
FIG. 10 is a cross-sectional view taken along the line X—X in FIG. 9.

FIG. 9 is an enlarged view of the A part in FIG. 4. FIG. 10 is a cross-sectional view taken along the line X—X in FIG. 9.

Referring to these figures, a LOCOS oxide film 16 is formed on a main surface of a p-type semiconductor substrate 10, for isolating cell regions from each other. A basic cell 1 including a pair of a p channel transistor 17 and an n channel transistor 18 is formed in the cell region. The p channel transistor 17 and the n channel transistor 18 are isolated from each other by a PN junction and a LOCOS oxide film 19. An insulating film 20 is provided, which covers the surface of the p-type semiconductor substrate 10.

Seven first interconnecting lines 400A, 400B, 400C, 400D, 400E, 400F and 400G are provided over the LOCOS oxide film 16 in the channel region with the insulating film 20 interposed therebetween. The first interconnecting lines 400A-400G are used for connecting the basic cells 1. A power supply line Vcc and a ground GND are provided with each of cell columns 200A and 200B interposed therebetween.

An interlayer insulating film 21 is provided over the p-type semiconductor substrate 10 and covers the p channel transistors 17, the n channel transistors 18, the grounds GND, the first interconnecting lines 400A-400G and power supply lines Vcc.

When the gate array is manufactured and stocked in advance, the interlayer insulating film 21 does not necessarily have to be formed.

A description will now be made of a method of manufacturing a semiconductor integrated circuit device using a gate array constructed as stated above.

A gate array without the interlayer insulating film 21 (see FIG. 10) is used in the embodiment stated below.

Figure 11:
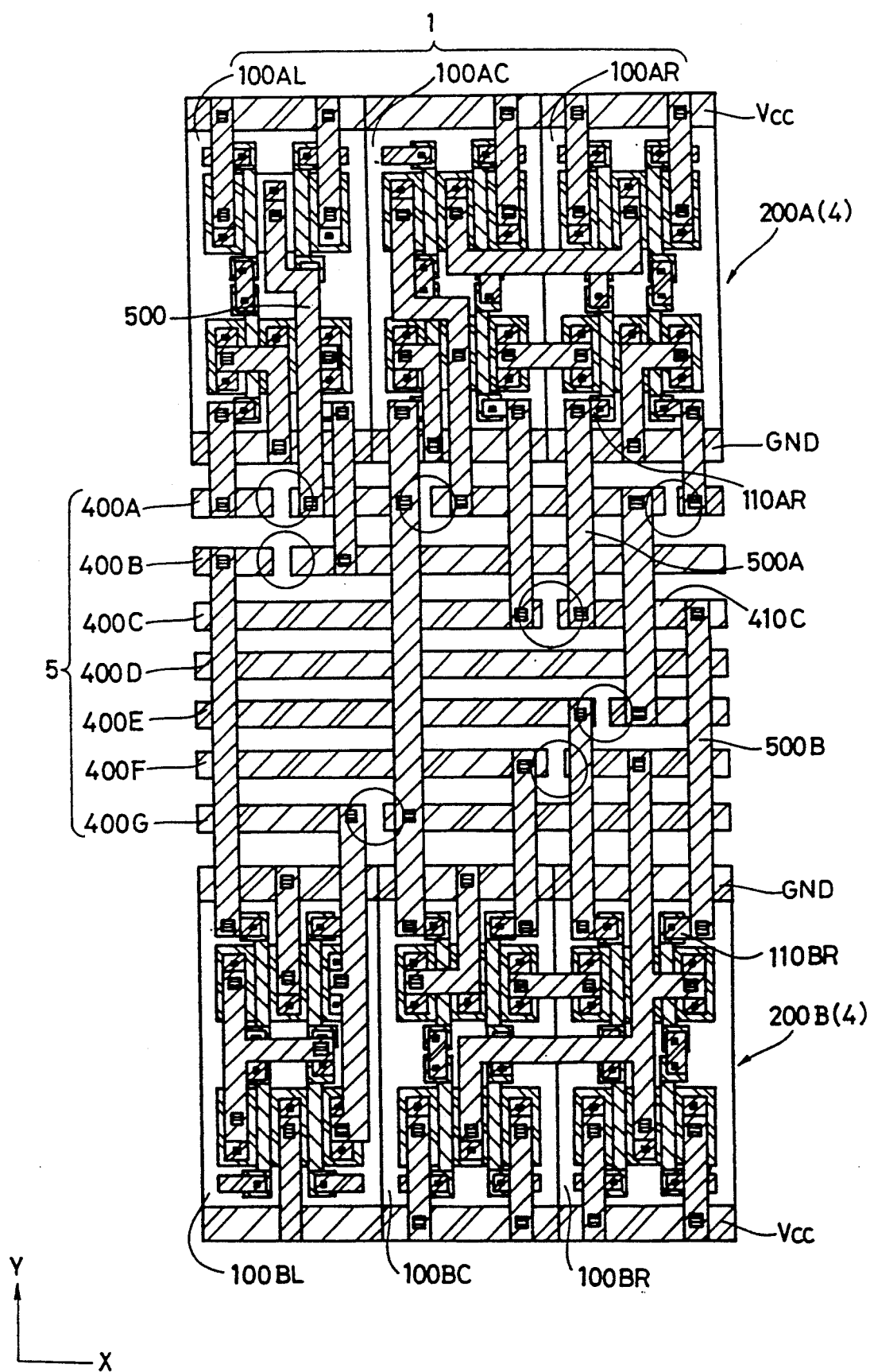
FIG. 11 is a diagram showing a method of manufacturing a semiconductor integrated circuit device using a gate array according to an embodiment of the present invention.

Referring to FIG. 11, the first interconnecting lines 400A-400G are cut at predetermined portions (surrounded by circles in FIG. 11) with a laser beam in accordance with design data on a circuit to be constructed. Then, an interlayer insulating film 21 (as shown in FIG. 13) is formed over the substrate, covering the cell columns 200A and 200B and the first interconnecting lines 400A-400G having been cut at the predetermined portions. Furthermore, through-holes 215 (as shown in FIG. 13) leading to the first interconnecting lines 400A-400G are formed in predetermined places of the interlayer insulating film by a mask (not shown) based on the above-mentioned design data.

A second interconnecting line 500 is formed on the interlayer insulating film where the through-holes are formed. The second interconnecting line 500 is connected to not only the first interconnecting lines 400A-400G but also to each of contacts 22 (see FIG. 10) of basic cells 100AL, 100AC, 100AR, 100BL, 100BC and 100BR through a through-hole (not shown) formed on the contact 22 of each of basic cells 100AL, 100AC, 100AR, 100BL, 100BC and 100BR. As the first interconnecting lines 400A-400G are formed parallel to cell columns 200A and 200B, that is, they extend in the X direction, the second interconnecting line 500 is formed at right angles to cell columns 200A and 200B, i.e., in the Y direction, in many cases.

For example, suppose that a contact 110AR of the basic cell 100AR in cell column 200A must be connected to a contact 110BR of the basic cell 100BR in cell column 200B. In this case, because the contact 110AR and the contact 110BR have a gap therebetween in the X direction, not only the second interconnecting line 500 but also the first interconnecting lines 400A-400G must be used. Here, the first interconnecting line 400C is used. That is, a second interconnecting line 500A connects the contact 110AR to a right end 410C obtained by cutting the first interconnecting line 400C and, furthermore, the right end 410C is connected to the contact 110BR by a second interconnecting line 500B.

Figure 12:
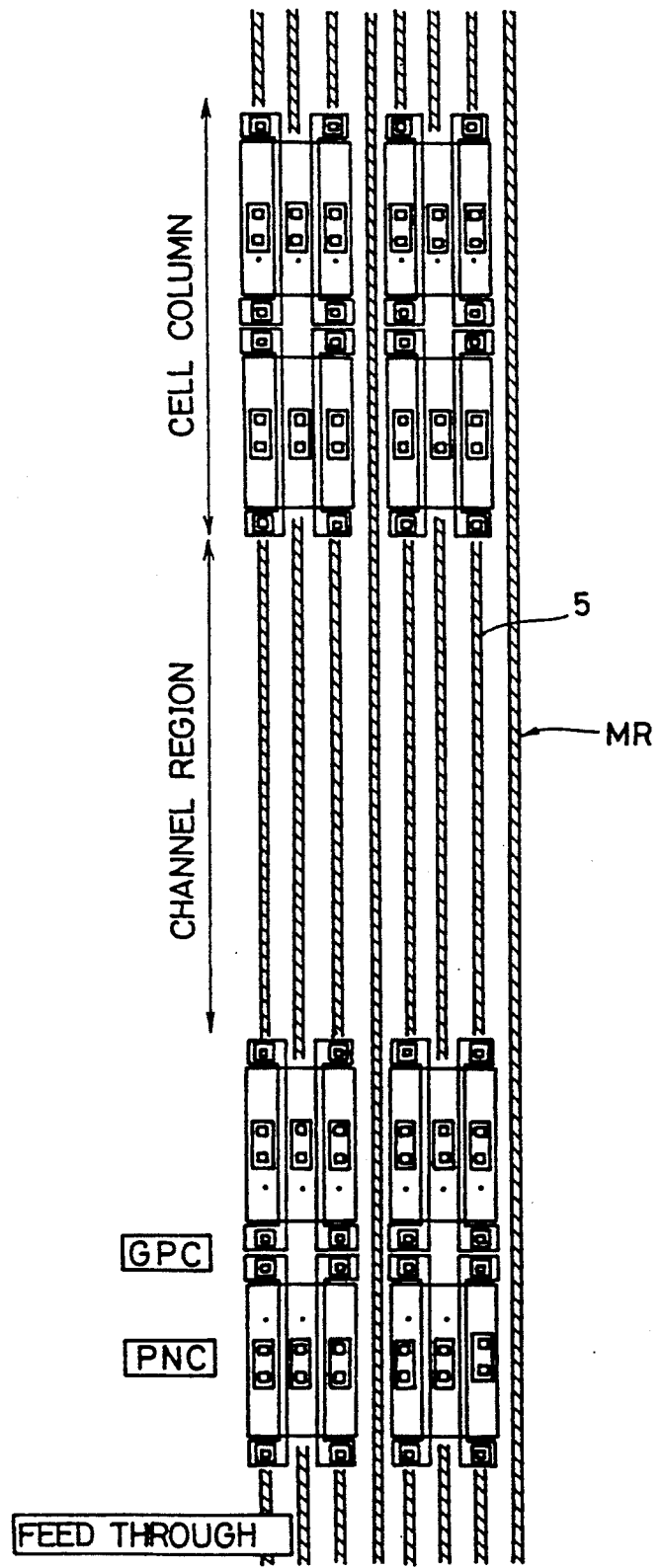
FIG. 12 shows a pattern of a gate array according to another embodiment of the present invention.

Although, the first interconnecting lines 400A-400G are formed parallel to cell columns 200A and 200B in the embodiment above, the present invention is not limited to this configuration and a first interconnecting line 5 may be formed at right angles to the cell columns as shown in FIG. 12. In this case, a second interconnecting line is often formed parallel to the cell columns.

Additionally, although the embodiment above has shown an example where the first interconnecting lines 400A-400G are cut with the laser beam before the interlayer insulating film is formed, the present invention is not limited to this.

For example, referring to FIGS. 9, 10 and 11, the interlayer insulating film 21 is formed on the first interconnecting lines 400A-400G. When a through-hole is formed in the interlayer insulating film 21, apertures are formed in the interlayer insulating film 21 for exposing portions of the first interconnecting lines 400A-400G to be cut in accordance with design data on a circuit to be constructed. Thereafter, the second interconnecting line 500 is formed on the interlayer insulating film 21. Then, when etching the second interconnecting line 500, the first interconnecting lines 400A-400G are etched through the apertures, for thereby cutting the desired portions of the first interconnecting lines 400A-400G. A semiconductor integrated circuit device thus manufactured achieves the same effects as those in the above described embodiment.

Additionally, although a case of two interconnection layers has been shown in the embodiment above, the present invention is not limited to this.

As stated above, in accordance with a gate array of the present invention, as a first interconnecting line for connecting basic cells is formed in a channel region in advance, it is not necessary to form the first interconnecting line when manufacturing a semiconductor integrated circuit device. Accordingly, the time period for development of a semiconductor integrated circuit device can be reduced as compared to a case where a conventional gate array is used.

Furthermore, in accordance with a method of manufacturing a semiconductor integrated circuit device using a gate array of the present invention, as formation of a double layered interconnection structure including first and second interconnecting lines is made possible as well as the reduction in the time period for the development, there is no increase in chip area.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method of manufacturing a semiconductor integrated circuit device, comprising the steps of:
   (a) preparing a gate array including the steps of,
       (1) preparing a semiconductor substrate having a main surface, said main surface including a cell region and a channel region adjacent to the cell region,
       (2) providing a cell column in said cell region which includes a plurality of basic cells arranged regularly,
       (3) providing a first interconnecting line in said channel region, which is to connect said basic cells;
   (b) cutting said first interconnecting line according to design data on the semiconductor integrated circuit device to be constructed;
   (c) forming an interlayer insulating film so as to cover said first interconnecting line over said semiconductor substrate;
   (d) forming a through-hole in said interlayer insulating film for exposing parts of said first interconnecting line or said basic cells; and
   (e) forming a second interconnecting line on said interlayer insulating film, which is electrically connected to said first interconnecting line or said basic cells through said throughhole.

2. The method of manufacturing the semiconductor integrated circuit device according to the claim 1, wherein said first interconnecting line is cut at said step (b) by a laser beam.

3. A method of manufacturing a semiconductor integrated circuit device, comprising the steps of:
   (a) preparing a gate array including the steps of,
       (1) preparing a semiconductor substrate having a main surface, said main surface including a cell region and a channel region adjacent to the cell region,
       (2) providing a cell column in said cell region which includes a plurality of basic cells arranged regularly,
       (3) providing a first interconnecting line in said channel region, which is to connect said basic cells;
   (b) forming an interlayer insulating film so as to cover said first interconnecting line over said semiconductor substrate;
   (c) forming a cutting aperture in said interlayer insulating film for exposing a portion of said first interconnecting line to be cut according to design data on the semiconductor integrated circuit device to be constructed, when forming a through-hole in said interlayer insulating film;
   (d) forming a second interconnecting line on said interlayer insulating film; and
   (e) etching said first interconnecting line through said cutting aperture when etching said second interconnecting line, thereby cutting said first interconnecting line.

4. A method of manufacturing a semiconductor integrated circuit device, comprising the steps of:
(a) preparing a gate array including the steps of,
  (1) preparing a semiconductor substrate having a main surface, said main surface including a cell region and a channel region adjacent to the cell region,
  (2) providing a cell column in said cell region which includes a plurality of basic cells arranged regularly,
  (3) providing a first interconnecting line in said channel region, which is to connect said basic cells, and
  (4) forming an interlayer insulating film so as to cover said first interconnecting line over said semiconductor substrate;
(b) forming a cutting aperture in said interlayer insulating film for exposing a portion of said first interconnecting line to be cut according to design data on the semiconductor integrated circuit device to be constructed when forming a through-hole in said interlayer insulating film;
(c) forming a second interconnecting line on said interlayer insulating film; and
(d) etching said first interconnecting line through said cutting aperture when etching said second interconnecting line, thereby cutting said first interconnecting line.

* * * * *